United States Patent
Goh et al.

(10) Patent No.: US 9,029,265 B2
(45) Date of Patent: May 12, 2015

(54) METHOD FOR FORMING SEMICONDUCTOR STRUCTURE

(71) Applicant: United Microelectronics Corp., Hsinchu (TW)

(72) Inventors: Sun-Hoi Goh, Singapore (SG); Seng-Wah Liau, Singapore (SG); Zhen-Zhen Wang, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/053,696

(22) Filed: Oct. 15, 2013

(65) Prior Publication Data
US 2015/0104943 A1  Apr. 16, 2015

(51) Int. Cl.
*H01L 21/311* (2006.01)
*H01L 21/308* (2006.01)
*H01L 21/3105* (2006.01)

(52) U.S. Cl.
CPC ........ *H01L 21/308* (2013.01); *H01L 21/31053* (2013.01)

(58) Field of Classification Search
CPC ............ H01L 21/76804; H01L 21/311; H01L 21/76813
USPC .......................... 438/700, 637, 638, 639, 640
See application file for complete search history.

(56) References Cited

U.S. PATENT DOCUMENTS

| 7,514,347 | B2 | 4/2009 | Hsu et al. | |
|---|---|---|---|---|
| 7,550,377 | B2 | 6/2009 | Liu et al. | |
| 8,389,663 | B2 * | 3/2013 | Brock et al. | 528/41 |
| 2004/0038520 | A1 * | 2/2004 | Seto et al. | 438/637 |
| 2004/0058277 | A1 * | 3/2004 | He et al. | 430/296 |
| 2010/0227471 | A1 * | 9/2010 | Leung et al. | 438/637 |

* cited by examiner

*Primary Examiner* — Brett Feeney
*Assistant Examiner* — James Chin
(74) *Attorney, Agent, or Firm* — WPAT, PC; Justin King

(57) ABSTRACT

A method for forming a semiconductor structure. A dielectric layer including adjacent first and second dielectric regions is formed on a substrate. The dielectric layer includes a curable material. The first dielectric region is cured. A portion of the second dielectric region is etched to form an opening and leave a remaining portion of the second dielectric region. After the etching step, the remaining portion of the second dielectric region is cured.

17 Claims, 4 Drawing Sheets

METHOD FOR FORMING SEMICONDUCTOR STRUCTURE

BACKGROUND

1. Technical Field

The disclosure relates to a method for forming a semiconductor structure, and more particularly to a method for forming an opening in a dielectric layer.

2. Description of the Related Art

With the rapid reduction in dimensions of IC devices, the line pitch of interconnect is constantly decreasing. Because the RC delay effect gets more significant at reduced line pitch, $SiO_2$ with a dielectric constant near 4.0 cannot be used as an IMD material in the interconnect structure. Therefore, low-k materials are widely used instead of $SiO_2$ to reduce the parasitic capacitance, so as to inhibit the RC delay effect and the cross-talking effect and improve the operation speed. One of current low-k materials is a porous material having small voids or pores therein.

SUMMARY

According to one embodiment, a method for forming a semiconductor structure is provided, comprising following steps. A dielectric layer comprising adjacent first and second dielectric regions is formed on a substrate. The dielectric layer comprises a curable material. The first dielectric region is cured. A portion of the second dielectric region is etched to form an opening and leave a remaining portion of the second dielectric region. After the etching step, the remaining portion of the second dielectric region is cured.

According to another embodiment, a method for forming a semiconductor structure is provided, comprising following steps. A dielectric layer comprising adjacent and non-overlapping first and second dielectric regions is formed on a substrate. A patterned light-cutting layer is formed on the second dielectric layer. The first dielectric region is irradiated. After irradiating the first dielectric region, the patterned light-cutting layer is removed. The second dielectric region is irradiated.

DETAILED DESCRIPTION

FIG. 1A to FIG. 1H illustrate method for forming a semiconductor structure.

Figure 1A:
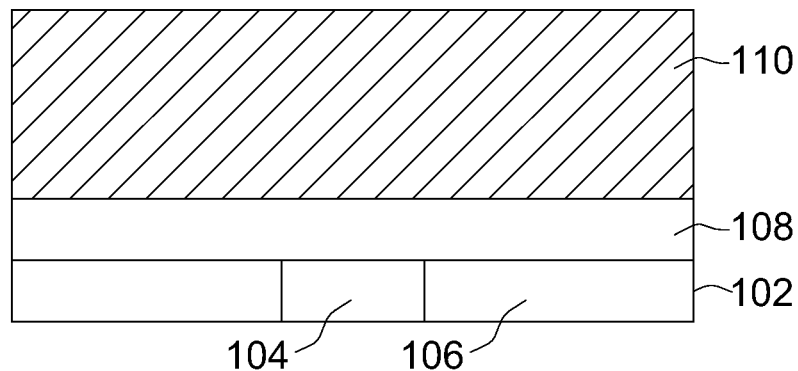
FIG. 1A to FIG. 1H illustrate method for forming a semiconductor structure.

Referring to FIG. 1A, a substrate 102 having a conductive layer 104 embedded in a dielectric film 106 is provided. The conductive layer 104 may comprise a metal such as copper, or other suitable conductive materials. A dielectric film 108, for example comprising nitrogen-doped carbide (NDC) or other suitable dielectric materials, may be formed on the substrate 102.

Referring to FIG. 1A, a dielectric layer 110 may be formed on the dielectric film 108. In embodiments, the dielectric layer 110 comprises a curable material which can be cured to form a porous low-k material (or ultra-low-k material) by a curing step such as an irradiating step or a heating step. In one embodiment, the dielectric layer 110 is a composite film having a dielectric backbone network film and a porogen component in the network film. For example, the dielectric layer 110 may comprise a carbon-doped $SiO_2$ network film and a $C_xH_y$ organic porogen, formed by a plasma process using diethylmethylsiloxane (DEMS) as a precursor for the network film and the $C_xH_y$ as a porogen precursor. Other suitable materials or deposition methods for porous low-k materials may be used.

Figure 1B:
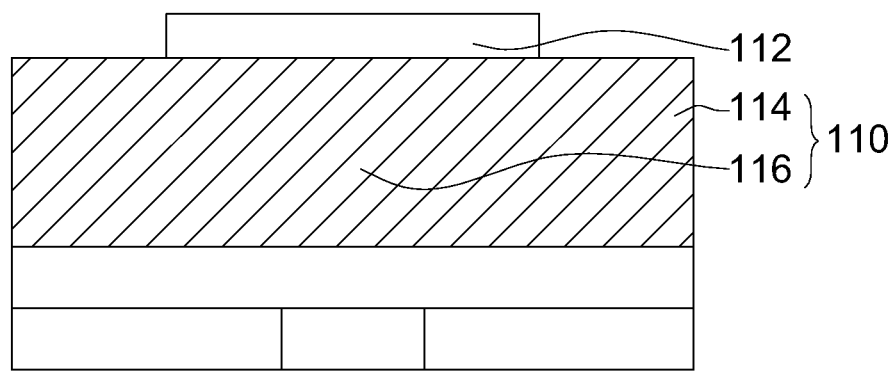

Referring to FIG. 1B, a patterned light-cutting layer 112 exposing a first dielectric region 114 of the dielectric layer 110 is formed on a second dielectric region 116 of the dielectric layer 110 adjacent to the first dielectric region 114. As shown in FIG. 1B, the first dielectric region 114 and the second dielectric region 116 are non-overlapping.

A light-cutting material used in embodiments may be a UV reflection material effective in UV reflection only, such as a UV-SiN layer; a UV absorption material effective in UV absorption only, such as a SiON layer, and/or a UV reflection-absorption material that is effective in both reflection and absorption. The reflectivity of the UV reflection or reflection-absorption material may be up to 0.5 or higher. The light-cutting material may include a nitrogen-containing compound, a carbon-containing compound or an oxygen-containing compound, such as SiN, SiON, nitrogen-doped carbide (NDC), oxygen-doped carbide (ODC), etc.

Figure 1C:
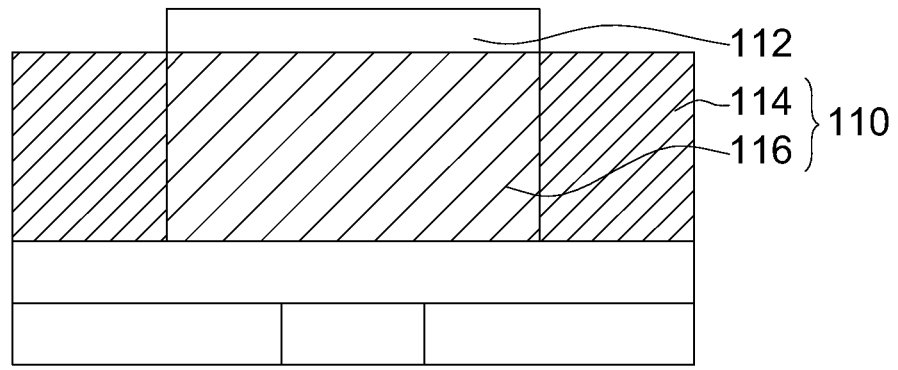

Referring to FIG. 1C, the first dielectric region 114 exposed by the patterned light-cutting layer 112 is cured by an irradiation step, such as a UV irradiation, to remove the porogen component from or create voids in, the network film and form a porous low-k material. The second dielectric region 116 is not cured by this irradiation step since it is protected by the patterned light-cutting layer 112.

Figure 1D:
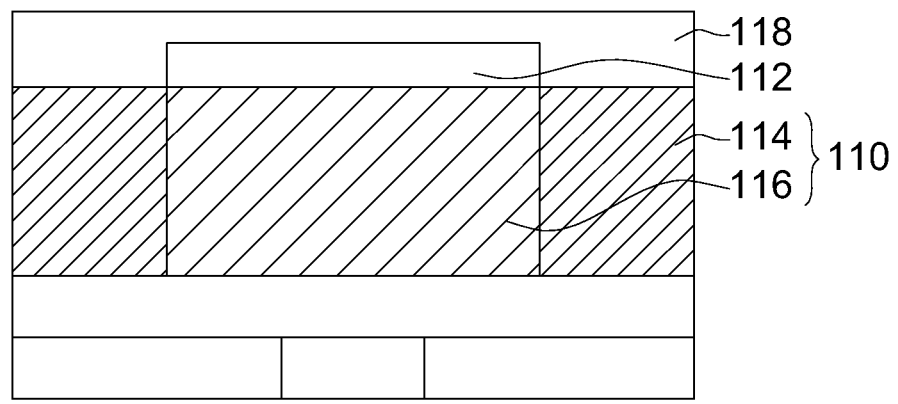

Referring to FIG. 1D, a light-cutting layer 118 is formed to cover the first dielectric region 114 and the patterned light-cutting layer 112.

Figure 1E:
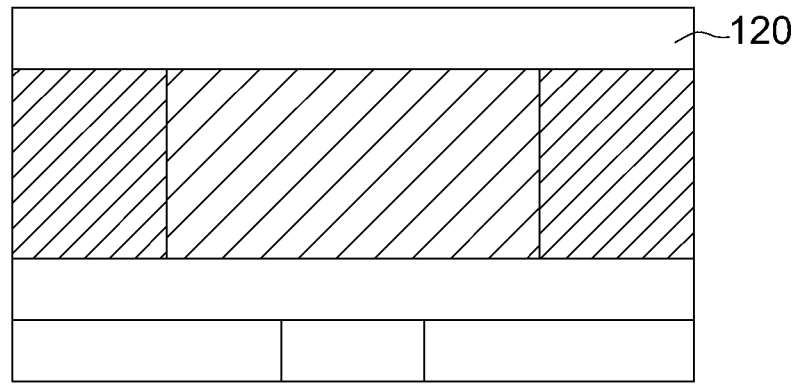

Referring to FIG. 1E, a surface of the light-cutting layer 118 (or further the patterned light-cutting layer 112, shown in FIG. 1D) may be smoothed by a planarization step such as a chemical mechanical polishing step, to form a light-cutting layer 120.

Figure 1F:
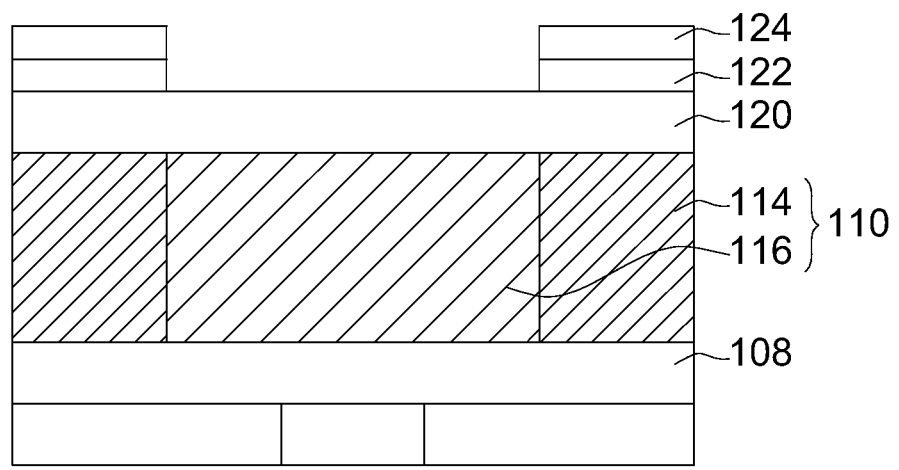

Referring to FIG. 1F, a patterned mask 122 and a patterned cap layer 124 are formed on the light-cutting layer 120. The patterned mask 122 may comprise TiN, or other suitable materials. The patterned cap layer 124 may comprise SiON or other suitable materials.

Figure 1G:
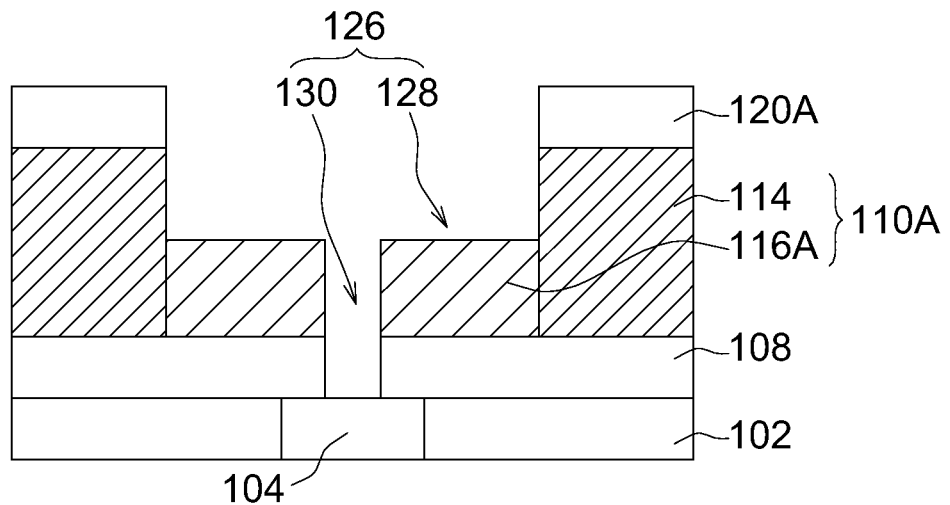

Referring to FIG. 1G, portions of the light-cutting layer 120, the second dielectric region 116 (FIG. 1F) and the dielectric film 108 are removed to form an opening 126 exposing the conductive layer 104 in the substrate 102, and leave a patterned light-cutting layer 120A and a remaining portion of the second dielectric region 116A of a dielectric layer 110A. In one embodiment, the opening 126 comprises a trench 128 on the remaining portion of the second dielectric region 116A, and a via 130 passing through the remaining portion of the second dielectric region 116A. The trench 128 is wider than the via 130 communicated with the trench 128. In one embodiment, the opening 126 may be formed by a "trench-first" process comprising the following steps. The trench 128 is formed by etching an upper portion of the second dielectric region 116 (FIG. 1F) by using the patterned mask 122 as an etching mask. Then, another patterned mask (not shown) such as a patterned photoresist is formed on the first dielectric region 114 and the second dielectric region 116, and the via 130 is formed by etching a portion of the second dielectric region 116 by using the other patterned mask as an etching mask. Then, the patterned mask 122, the patterned cap layer 124 and the other patterned mask are removed. In other embodiments, the opening 126 may be formed by other suitable methods such as "via-first" or "self-aligned" processes.

Figure 1H:
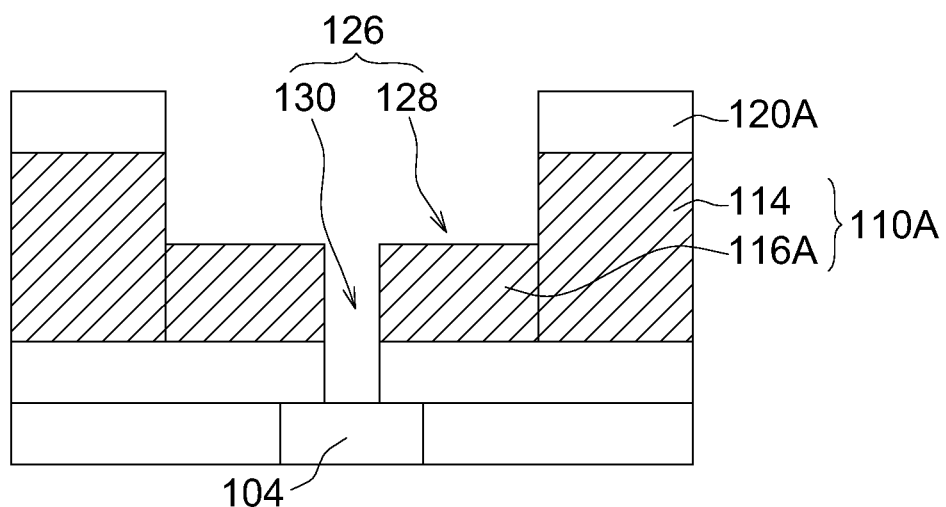

Referring to FIG. 1H, the remaining portion of the second dielectric region 116A is cured to form a porous low-k material by an irradiation step such as a UV irradiation. In one embodiment, the first dielectric region 114 is not further cured by this irradiation step since it is covered by the patterned light-cutting layer 120A. In other embodiments, this irradiation step may be performed after the patterned light-cutting layer 120A is removed so as to irradiate both the first dielectric region 114 and the remaining portion of the second dielectric region 116A.

In embodiments, the remaining portion of the second dielectric region 116A is cured (described referring to FIG. 1H) after the etching step for the opening 126 (described referring to FIG. 1G), and the porous low-k material of the remaining portion of the second dielectric region 116A formed by the curing step is subjected to no etching step; therefore, the porous low-k material can have good structural characteristics. In a comparative example (not shown), an opening is formed by etching a wholly-cured dielectric layer, and the etching step disadvantageously damages a porous material of the cured dielectric layer and results in a higher k-value than the dielectric layer 110A of embodiments.

In embodiments, the opening 126 is then filled with a conductive material (not shown) that may comprise a metal so as to form an interconnect structure, such as a dual damascene, electrically connecting to the underlying conductive layer 104.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor structure, comprising:
    forming a dielectric layer comprising adjacent first and second dielectric regions on a substrate and comprising a curable material;
    forming a patterned light-cutting layer on the second dielectric region,
    curing the first dielectric region, wherein during curing the first dielectric region, the second dielectric region is covered by the patterned light-cutting layer;
    etching a portion of the second dielectric region to form an opening and leave a remaining portion of the second dielectric region;
    forming another patterned light-cutting layer on the cured first dielectric region; and
    curing the remaining portion of the second dielectric region after the etching step, wherein during curing the remaining portion of the second dielectric region, the cured first dielectric region is covered by the another patterned light-cutting layer.

2. The method for forming the semiconductor structure according to claim 1, wherein the first dielectric region and the second dielectric region are non-overlapping.

3. The method for forming the semiconductor structure according to claim 1, wherein the first dielectric region is cured to form a porous low-k material.

4. The method for forming the semiconductor structure according to claim 1, wherein the curing step comprises a UV irradiation.

5. The method for forming the semiconductor structure according to claim 1, wherein the remaining portion of the second dielectric region is cured to form a porous low-k material.

6. The method for forming the semiconductor structure according to claim 1, wherein the remaining portion of the second dielectric region is cured by a UV irradiation.

7. The method for forming the semiconductor structure according to claim 1, further comprising forming a patterned mask on the cured first dielectric region, wherein the portion of the second dielectric region is etched by using the patterned mask as an etching mask.

8. The method for forming the semiconductor structure according to claim 7, further comprising removing the patterned mask.

9. The method for forming the semiconductor structure according to claim 1, wherein the opening comprises:
    a trench on the remaining portion of the second dielectric region; and
    a via passing through the remaining portion of the second dielectric region.

10. The method for forming the semiconductor structure according to claim 9, wherein the trench is wider than the via communicated with the trench.

11. A method for forming a semiconductor structure, comprising:
    forming a dielectric layer comprising adjacent and non-overlapping first and second dielectric regions on a substrate;
    forming a patterned light-cutting layer on the second dielectric layer;
    irradiating the first dielectric region;
    after irradiating the first dielectric region, removing the patterned light-cutting layer and etching a portion of the second dielectric region by masking all of the cured first dielectric region; and
    irradiating the second dielectric region, wherein after the first dielectric region is irradiated and before the second dielectric region is irradiated, forming another patterned light-cutting layer on the first dielectric region.

12. The method for forming the semiconductor structure according to claim 11, wherein the first dielectric region and the second dielectric region comprise a curable material and are irradiated to form a porous low-k material.

13. The method for forming the semiconductor structure according to claim 12, wherein the first dielectric region and the second dielectric region are irradiated by a UV light.

14. The method for forming the semiconductor structure according to claim 12, wherein the step of etching the portion of the second dielectric region forms an opening and leaves a remaining portion of the second dielectric region.

15. The method for forming the semiconductor structure according to claim 14, wherein the step of irradiating the second dielectric region comprises irradiating the remaining portion of the second dielectric region.

16. The method for forming the semiconductor structure according to claim 14, wherein the opening comprises:
    a trench on the remaining portion of the second dielectric region; and
    a via passing through the remaining portion of the second dielectric region.

17. The method for forming the semiconductor structure according to claim 16, wherein the trench is wider than the via communicated with the trench.

* * * * *